United States Patent
Song

(10) Patent No.: US 7,880,162 B2
(45) Date of Patent: Feb. 1, 2011

(54) QUANTUM DEVICE, CONTROL METHOD THEREOF AND MANUFACTURING METHOD THEREOF

(75) Inventor: Haizhi Song, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 585 days.

(21) Appl. No.: 11/898,116

(22) Filed: Sep. 10, 2007

(65) Prior Publication Data
US 2008/0012003 A1 Jan. 17, 2008

Related U.S. Application Data

(63) Continuation of application No. PCT/JP2005/004307, filed on Mar. 11, 2005.

(51) Int. Cl.
*H01L 29/06* (2006.01)
*H01L 31/00* (2006.01)

(52) U.S. Cl. .................. 257/13; 257/9; 257/14; 257/103; 257/E33.008; 257/E33.033; 257/E33.069; 257/E33.071; 438/962; 977/773; 977/774; 977/933; 977/937

(58) Field of Classification Search .......... 257/9, 257/13, 14, 103, E33.008, E33.033, E33.069, 257/E33.071; 438/962; 977/773–774, 933, 977/937
See application file for complete search history.

(56) References Cited

U.S. PATENT DOCUMENTS

| | | | | |
|---|---|---|---|---|
| 5,440,148 A * | 8/1995 | Nomoto | ............... | 257/21 |
| 5,663,571 A * | 9/1997 | Ugajin | ............... | 257/17 |
| 6,281,519 B1 * | 8/2001 | Sugiyama et al. | ............... | 257/14 |
| 6,507,042 B1 * | 1/2003 | Mukai et al. | ............... | 257/14 |
| 6,573,527 B1 * | 6/2003 | Sugiyama et al. | ............... | 257/14 |
| 6,768,754 B1 * | 7/2004 | Fafard | ............... | 372/43.01 |
| 6,770,916 B2 * | 8/2004 | Ohshima | ............... | 257/104 |
| 6,824,501 B2 * | 11/2004 | Kuo | ............... | 482/54 |
| 2002/0162995 A1 * | 11/2002 | Petroff et al. | ............... | 257/21 |
| 2004/0071019 A1 * | 4/2004 | Magnus et al. | ............... | 365/200 |
| 2005/0092980 A1 * | 5/2005 | Chen et al. | ............... | 257/14 |
| 2005/0155641 A1 * | 7/2005 | Fafard | ............... | 136/249 |

(Continued)

FOREIGN PATENT DOCUMENTS

JP  10-104181  4/1998

(Continued)

OTHER PUBLICATIONS

Chernobrod et al.—Spin microscope based on optically detected magnetic resonance. Chernobrod, Boris M. and Gennady P. Berman. American Institute of Physics. Dec. 10, 2004. pp. 014903.1-014903.3.*

(Continued)

*Primary Examiner*—Zandra Smith
*Assistant Examiner*—Jeremy J Joy
(74) *Attorney, Agent, or Firm*—Fujitsu Patent Center

(57) ABSTRACT

A quantum dot (22) is formed on a GaAs substrate (20). In the quantum dot (22), a single electron exists. A cap layer (26) is formed on a surrounding area of the quantum dot (22), and a barrier layer (28) is formed thereon. A quantum dot (30) for detection is formed on the barrier layer (28). Then, a cap layer (34) covering the quantum dot (30) and the like is formed.

17 Claims, 7 Drawing Sheets

U.S. PATENT DOCUMENTS

2005/0194608 A1* 9/2005 Chen ................... 257/100
2005/0230693 A1* 10/2005 Chen ................... 257/89

FOREIGN PATENT DOCUMENTS

| JP | 11-54715 | | 2/1999 |
| JP | 11054715 A | * | 2/1999 |
| JP | 2000-68495 | | 3/2000 |
| JP | 2003-86788 | | 3/2003 |
| JP | 2003-338618 | | 11/2003 |
| JP | 2004-103952 | | 4/2004 |

OTHER PUBLICATIONS

J.M. Elzerman, et al.; "Single-shot read-out of an individual electron spin in a quantum dot;" *Nature*; vol. 430, Jul. 22, 2004, pp. 431-435.

M. Friesen, et al.; "Spin Readout and Initialization in a Semiconductor Quantum Dot;" *Physical Review Letters*; vol. 92; No. 3; Jan. 23, 2004; pp. 037901-1-037901-4.

A. Shabaev, et al.; "Optical readout and initialization of an electron spin in a single quantum dot;" *Physical Review B*; vol. 68; 2003; pp. 201305-1-201305-4.

J.M. Garcia, et al.; "Intermixing and shape changes during the formation of InAs self-assembled quantum dots;" *Appl. Phys. Lett.*; vol. 71; No. 14; Oct. 6,1997; pp. 2014-2016.

B.M. Chernobrod, et al.; "Spin microscope based on optically detected magnetic resonance;" *Journal of Applied Physics*; vol. 97; 2005; pp. 014903-1-014903-3.

M. Kroutvar, et al.; "Optically programmable electron spin memory using semiconductor quantum dots;" *Nature*; vol. 432; Nov. 4, 2004; pp. 81-84.

\* cited by examiner

QUANTUM DEVICE, CONTROL METHOD THEREOF AND MANUFACTURING METHOD THEREOF

This application is a continuation of international application PCT/JP05/004307 filed Mar. 11, 2005.

TECHNICAL FIELD

The present invention relates to a quantum device having quantum dots, a control method thereof, and a manufacturing method thereof.

BACKGROUND ART

In a quantum computer having a quantum dot, it is necessary that a spin state of an electron inside the quantum dot is read out. To this date, a read-out method using a single electron transistor (Nonpatent document 1 and Nonpatent document 2), a read-out method emitting a light to the quantum dot to read out from a polarized light emission intensity (Nonpatent document 3), and so forth are proposed.

However, in the method using the single electron transistor, there is a problem of requiring a complicated structure in addition to a problem of a shorter coherence lifetime. Moreover, the size of the single electron transistor itself increases as well.

Further, in the method of exciting the quantum dot by light, an interaction is caused between an exciton and an electron in the quantum dot in that the light is emitted directly to the quantum dot. Therefore, there is a possibility that correct information could not be read out due to a variation of a spin state of the electron.

Patent document 1: Japanese Patent Application Laid-Open No. 2004-103952
Patent document 2: Japanese Patent Application Laid-Open No. 2000-68495
Patent document 3: Japanese Patent Application Laid-Open No. 2003-86788
Patent document 4: Japanese Patent Application Laid-Open No. 2003-338618
Nonpatent document 1: J. M. Elzerman et al., Nature 430, 431 (2004)
Nonpatent document 2: M. Friesen et al., Phys. Rev. Lett. 92, 037901 (2004)
Nonpatent document 3: A. Shabaev et al., Phys. Rev. B 68, 201305R (2003)
Nonpatent document 4: J. M. Garcia et al. Appl. Phys. Lett. 71, 2014 (1997)

SUMMARY OF THE INVENTION

An object of the present invention is to provide a quantum device capable of reading out information from a quantum dot correctly with a simple structure, a control method thereof, and a manufacturing method thereof.

As a solution to the problems, the present inventor has devised embodiments of the invention as will be described below.

The quantum device according to the present invention includes: a first quantum structure having a single electron; a second quantum structure capable of emitting light; and a barrier layer formed between the first and second quantum structures. A ground level (ground energy level) of an electron in the second quantum structure is higher than a ground level of an electron in the first quantum structure. Further, a band gap of the barrier layer is larger than band gaps of the first and second quantum structures.

A control method of a quantum device according to the present invention intends a control method of the quantum device including: a first quantum structure having a single electron; a second quantum structure capable of emitting light; and a barrier layer formed between the first and second quantum structures. It should be noted that a ground level (ground energy level) of an electron in the second quantum structure is higher than a ground level of an electron in the first quantum structure. Further, a band gap of the barrier layer is larger than band gaps of the first and second quantum structures. In the present control method, while a magnetic field is applied to the quantum device, a laser light pulse is focused onto the second quantum structure. Immediately after that, a microwave pulse is applied to the quantum device. Thereafter, a polarized light emission from the second quantum structure is detected.

In a manufacturing method of a quantum device according to the present invention, a first quantum structure is formed, and after that, a barrier layer is formed on or above the first quantum structure. Subsequently, a second quantum structure is formed on the barrier layer. It should be noted that a ground level of an electron in the second quantum structure is set to be higher than a ground level of an electron in the first quantum structure. Further, band gap of the barrier layer is set to be larger than band gaps of the first and second quantum structures.

DETAILED DESCRIPTION OF THE PREFERRED EMBODIMENTS

Hereafter, embodiments according to the present invention will be specifically described with reference to the attached drawings. We take the system based on GaAs as an example, but the present invention is not limited to GaAs-based system. All materials capable of forming semiconductor quantum structures can be the choices.

First Embodiment

First, the description will be given on the first embodiment of the present invention. Note that, for convenience, a structure of a section of a quantum device will be described together with a manufacturing method here. FIG. 1A to FIG. 1E are section views showing a manufacturing method of a quantum device according to the first embodiment of the present invention.

Figure 1A:
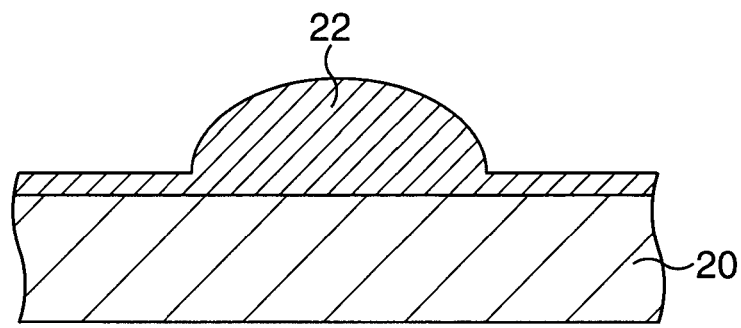
FIG. 1A is a section view showing a manufacturing method of a quantum device according to a first embodiment of the present invention in the order of process.

In the first embodiment, as shown in FIG. 1A, first, an InAs layer is grown on a GaAs substrate 20 by S-K (Stranski-Krastanow) growth mode to form a self-assembled quantum dot 22. The height of the quantum dot 22 is, for example, about 1 nm to 2 nm. Note that the method of forming the quantum dot 22 is not limited thereto, and a method described for example, in Patent document 4 can also be adopted. Specifically, an oxide film of a dot shape is formed on the GaAs substrate 20, and the oxide film is removed to form a recession. Subsequently, a semiconductor layer is grown in the recession. This formation method allows controlling the position of quantum dot.

Figure 1B:
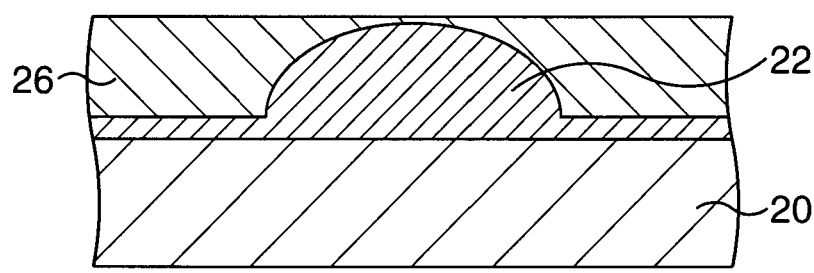
FIG. 1B is a section view continued from FIG. 1A and showing the manufacturing method of the quantum device in the order of the process.

Subsequently, as shown in FIG. 1B, a cap layer 26 is formed on a surrounding area of the quantum dot 22. The cap layer 26 can be, for example, a GaAs layer or an AlGaAs layer. The thickness of the cap layer 26 is roughly the same as the height of the quantum dot 22. Note that they are not necessarily quite the same, and the quantum dot 22 may protrude from the cap layer 26 or the quantum dot 22 may be covered by the cap layer 26.

Figure 1C:
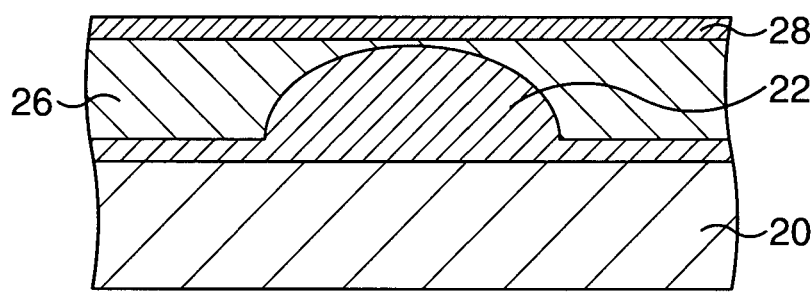
FIG. 1C is a section view continued from FIG. 1B and showing the manufacturing method of the quantum device in the order of the process.

Subsequently, as shown in FIG. 1C, a barrier layer 28 is formed all over the surface. As an example of the barrier layer 28, an AlAs layer or an AlGaAs layer may be formed. The composition of the barrier layer 28 may be the same as of the cap layer 26 as long as the barrier is high and thick enough to block the carrier transferring between the quantum dot 22 and the other quantum dot 30 to be described below. The thickness of the barrier layer 28 is, for example, about 1 nm to 2 nm.

Figure 1D:
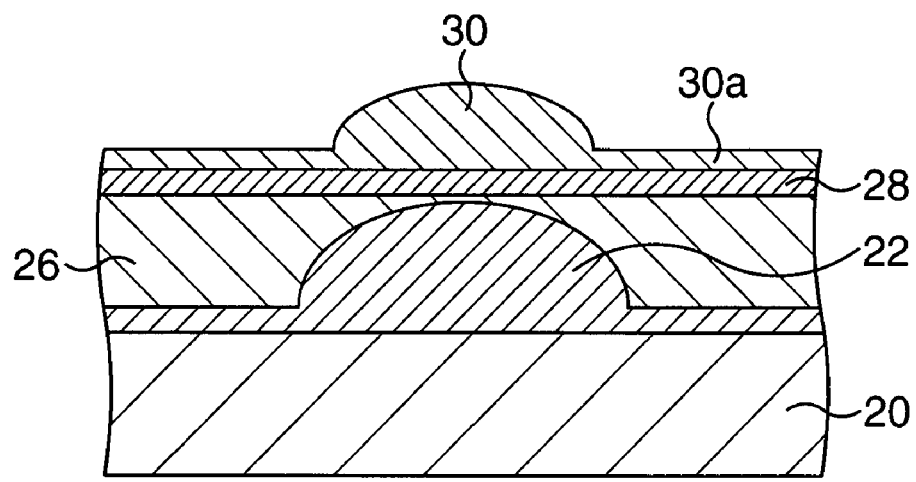
FIG. 1D is a section view continued from FIG. 1C and showing the manufacturing method of the quantum device in the order of the process.

After that, as shown in FIG. 1D, a quantum dot 30 for detection is formed on the barrier layer 28 by growing an InAlAs layer, for example, by the S-K growth mode. The quantum dot 30 is formed above the quantum dot 22. Further, the quantum dot 30 preferably has a lower height so that an electron spin-magnetic field of the quantum dot 22 sufficiently affects the quantum dot 30. For example, an effective distance between these is preferably 5 nm or below.

Further, the material of the quantum dot 30 is not limited to specific ones, however, it is necessary that the material have an energy level largely different from that of the quantum dot 22 and, at the same time, and that the material has a long exciton lifetime. The exciton lifetime is preferably 10 ns or above, for example. The longer exciton lifetime can be obtained from, for example, the indirect band gap along with the higher Al content as an ascription.

Figure 1E:
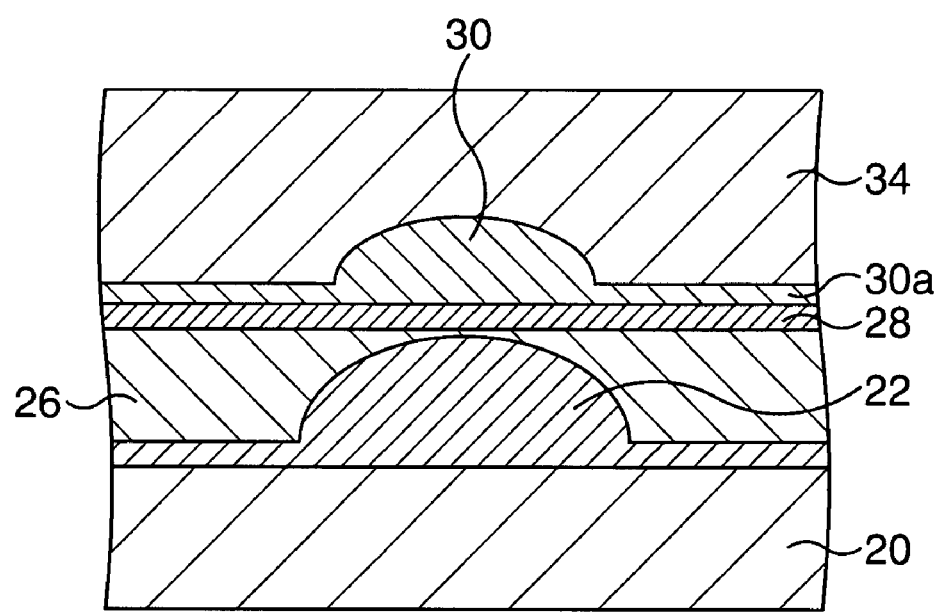
FIG. 1E is a section view continued from FIG. 1D and showing the manufacturing method of the quantum device in the order of the process.

Subsequently, as shown in FIG. 1E, a cap layer 34 covering the quantum dot 30 is formed. As an example of the cap layer 34, a GaAs layer or an AlGaAs layer may be formed.

Figure 2:
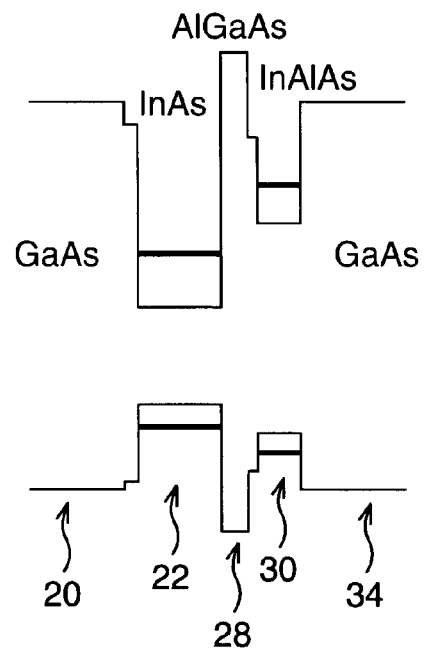
FIG. 2 is a band diagram showing an energy band of the quantum device according to the first embodiment.

The band diagram in the quantum device thus structured comes to one as shown in FIG. 2. Note that, preferably, the energy gap between the quantum dot 22 and the quantum dot 30 for detection is 100 meV or above.

Figure 3:
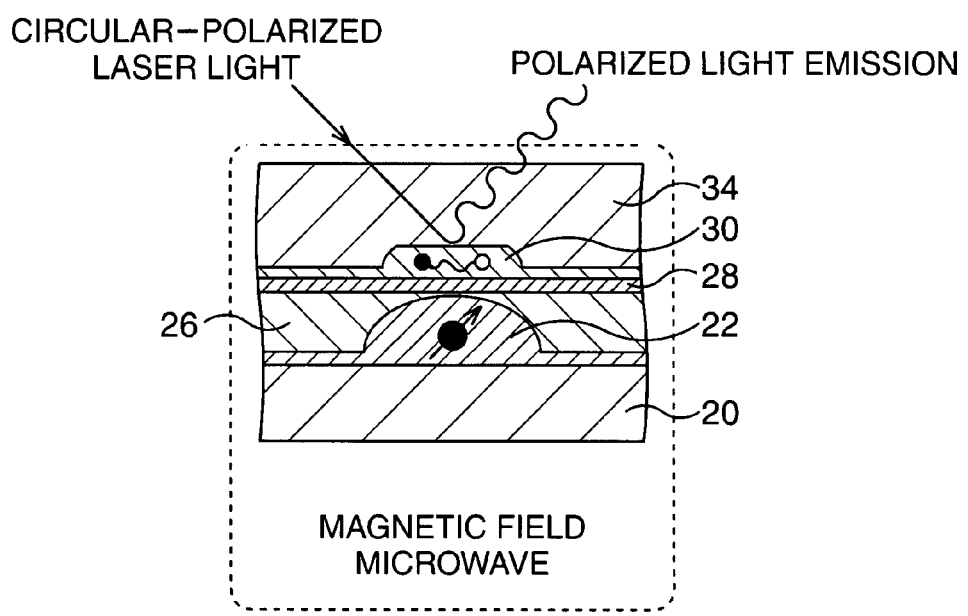
FIG. 3 is a view showing an operation of the quantum device according to the first embodiment.

Subsequently, description will be given on the operation of the quantum device according to the first embodiment. FIG. 3 is a view showing the operation of the quantum device according to the first embodiment.

The operation of the electron spin of the quantum dot 22 can be performed by ESR (Electron Spin Resonance). In a little more detail the electron spin of the quantum dot 22 can be operated by applying a microwave while the quantum device is under an applied magnetic field for a suitable time.

When reading out the state of the electronic spin of the quantum dot 22, as shown in FIG. 3, a method related to ESR, namely optically detected magnetic resonance (ODMR), is used. In this method, while using the same magnetic field and microwave setups as in the operation of spin in quantum dot 22, a optical tool is further introduced. First, the magnetic field is applied to the quantum device and, at the same time, a circular-polarized laser light pulse is incident onto the quantum dot 30 for detection.

Figure 4:
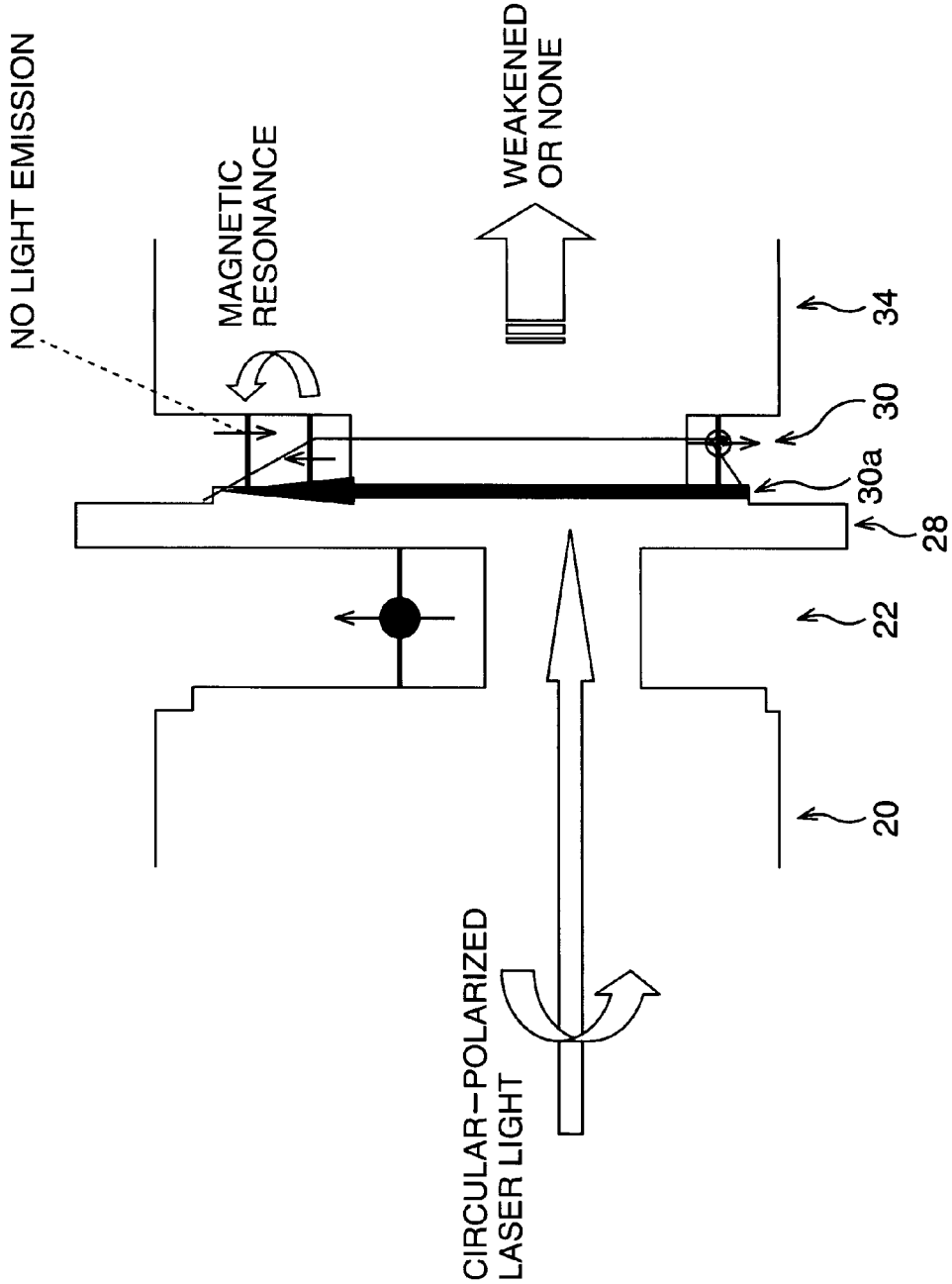
FIG. 4 is a diagram showing the operation mechanism (ODMR) of the quantum device.

Although the magnitude of the magnetic field depends on a g-factor of the electron in the quantum dot 30 for detection and the frequency of the microwave applied later, for example, it is about 0.1 T to about several T. In the quantum dot 22, there arises a spin splitting by the application of the magnetic field, as shown in FIG. 4. One can see a variation in the electron spin state in the second quantum structure by ESR and the laser excitation and light emission process of the second quantum structure. The energy gap generated as a result thereof is about several tens µeV.

As for the circularly-polarized laser light pulse, it is preferable to set its polarization to be the same as the emitted light corresponding to the low-energy electron spin level, and to adjust its energy so that it resonates with a wetting layer 30a grown all over the surface of the barrier layer 28 as an initial layer or resonates with the low-energy electron spin level of the quantum dot 30. Note that, in the case of resonating with the wetting layer, as shown in FIG. 4, there arises a relaxation in which the exciton (electron-hole pair) makes a transit to the low-energy electron spin level and hole level of the quantum dot 30 for detection. The exciton thereby occupies the low-energy electron spin level and hole level.

Note that, as the exciting circularly-polarized laser light, preferably, that not exciting the quantum dot 22 is used, and, more preferably, that not exciting the other portion in the quantum device as well is used. Further, the precise control of the position at a nanolevel when the circular-polarized laser light is emitted can be conducted, for example, by using a near-field optical microscope.

In the state when the magnetic field is still applied, just after the exciting circularly-polarized laser pulse is applied and before the electron and hole in the quantum dot 30 are recombined to emit light, a pulsed microwave is applied to the quantum device. The application time is, for example, about the same level (in the order of 10 ns) as of a spin-flip (spin inversion). Note that the frequency of the microwave is set to resonate with the electron spin splitting in the quantum dot 30 for detection. For example, it can be in X-band of about 10 GHz, and more preferably, W-band around 95 GHz. With appropriate adjustment of power and pulse width of the microwave, as shown in FIG. 4, the electron spin at the low-energy level transits to the high-energy level along with the spin-flip as in the case of the electron spin resonance (ESR).

In case of no spin-flip in quantum dot 30, it will emit circularly-polarized light through the recombination of the hole and the lower-energy electron. As a result of electron spin-flip in quantum dot 30, as shown in FIG. 4, the polarized light emission corresponding to the lower electron spin level is in principle disappearing or practically weakened. This is because the magnetic resonance is conditioned only to the electron, and the spin-flip of the hole is not caused.

Figure 5A:
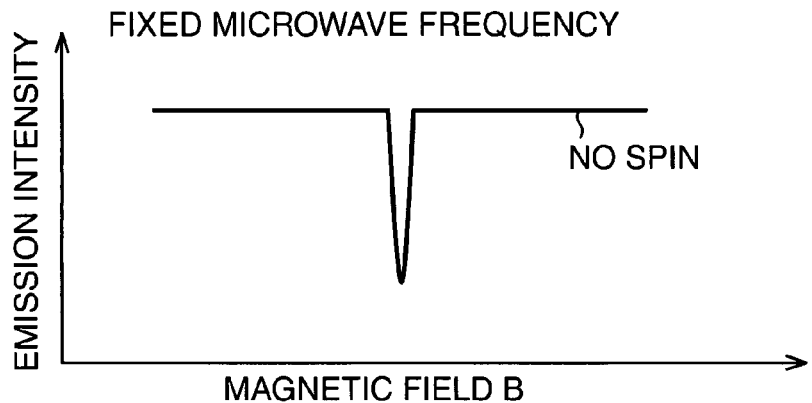
FIG. 5A is a graph showing the relation between the external magnetic field and the light emission intensity in the case where no spin (no electron) exists in the first quantum structure.
Figure 5B:
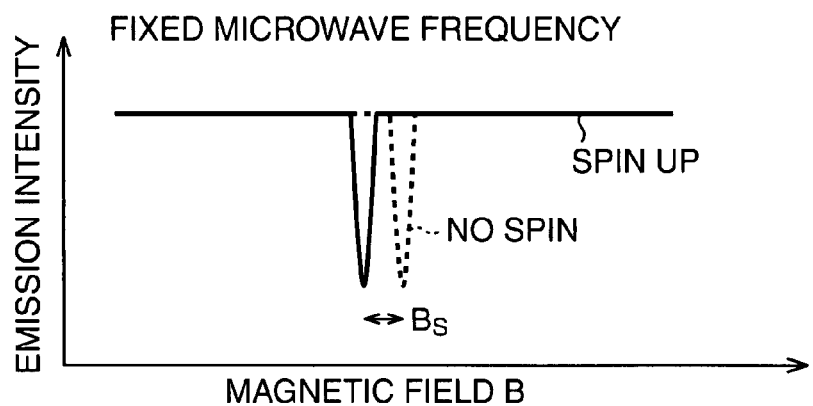
FIG. 5B is a graph showing the relation between the external magnetic field and the light emission intensity in the case where an up spin exists in the first quantum structure.
Figure 5C:
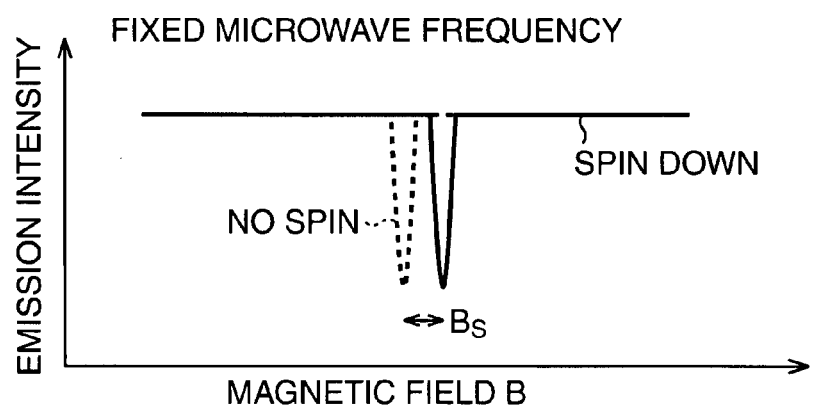
FIG. 5C is a graph showing the relation between the external magnetic field and the light emission intensity in the case where a down-spin exists in the first quantum structure.

In order to explain further why the light emission intensity changes, FIGS. 5A to 5C show the relations between the electron spin state of the quantum dot 22 and the polarized light emission intensity in the quantum dot 30 for detection. FIG. 5A shows a variation in the light-emission intensity when the magnitude of an external magnetic field B applied from outside is changed in the case when there is no spin (no electron) in quantum dot 22. Further, FIG. 5B shows a variation in the light-emission intensity when the magnitude of the external magnetic field B is changed in the case of an up-spin electron in quantum dot 22, and FIG. 5C shows a variation in the light-emission intensity when the magnitude of the external magnetic field B is changed in the case of a down-spin electron in quantum dot 22. Note that the frequency of the microwave is fixed to a constant value.

As shown in FIGS. 5B and 5C, the magnitude of the external magnetic field B causing a sharp dip in the light-emission intensity by the magnetic resonance is different between the cases when the electron in quantum dot 22 spins up and down. Due to the good resolution of ODMR, the resonant value of magnetic field for spin up and down can be well distinguished. Fixing the magnetic field to the resonant value corresponding to electron spin up, for example, the detected light emission from quantum dot 30 will be weaker than normal in the case of electron spin up but be normal in the case of electron spin down in quantum dot 22. Accordingly, it is feasible to read out the electron spin state in quantum dot 22 in accordance with the magnitude of the intensity of the emitted polarized light from quantum dot 30.

After the electron spin state of quantum 22 is read out, the application of the external magnetic field is stopped and then may be reset for further spin operation or the next readout.

Figure 6:
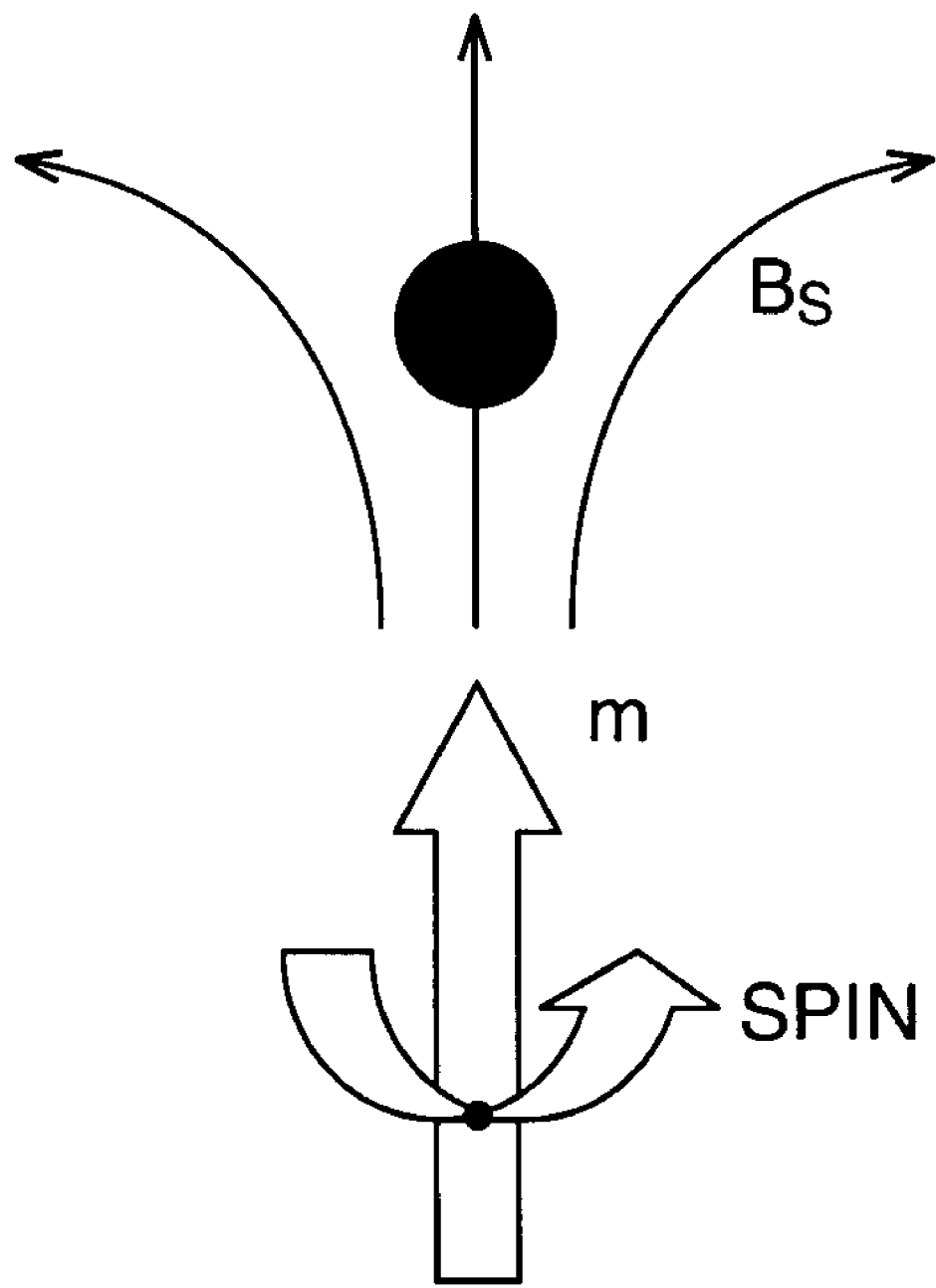
FIG. 6 is a view showing the principle of how a magnetic field is generated by a dipolar moment (coming from the electron spin of the first quantum structure in the present invention)

FIG. 6 is a view showing the principle of the magnetic field generated from a dipolar moment, which originates from the spin of electron in quantum dot 22. When a dipolar moment generated by the electron spin in the quantum dot 22 is defined as "m", a magnetic field $B_s$ (vector) at a position having a distance "r" from the spin can be expressed by equation 1 and equation 2. Note that "$\mu_0$" is the magnetic permeability of vacuum, "g" is the g-factor of the electron in quantum dot 22, and "$\mu_B$" is the Bohr magneton.

$$B_s = \frac{\mu_0}{4\pi} \frac{3(m \cdot r)r - mr^2}{r^5} \quad \text{[Equation 1]}$$

$$m = -\frac{1}{2} g \mu_B \quad \text{[Equation 2]}$$

Thus, the direction of the magnetic field $B_s$ at the position having a distance "r" from the spin varies in accordance with the state of the spin. In the present embodiment, the quantum dot 30 for detection is arranged at such a position as described above. Note that, when the distance "r" is about 1 nm, the magnitude of the magnetic field $B_s$ comes to about 2 mT, and when the distance "r" is about 10 nm, the magnitude of the magnetic field $B_s$ comes to about 0.002 mT. The magnitude of the magnetic field $B_s$ equals to the transition amount of the dip in FIG. 5B and FIG. 5C. Accordingly, as the distance "r" becomes small, the transition amount of the dip increases to thereby increase the readout resolution, being preferable.

According to the first embodiment as described above, the spin state in the quantum dot 22 can be read out with a simple structure. Further, the target of the circularly-polarized laser pulse is the quantum dot 30 for detection; therefore, the circularly-polarized laser light is not required to excite the quantum dot 22, so that the spin state does not vary along with the excitation. Accordingly, a correct spin state can be read out.

Note that, resonant condition in ODMR above can be fit by tuning both the magnetic field and/or the microwave frequency.

Second Embodiment

Figure 7A:
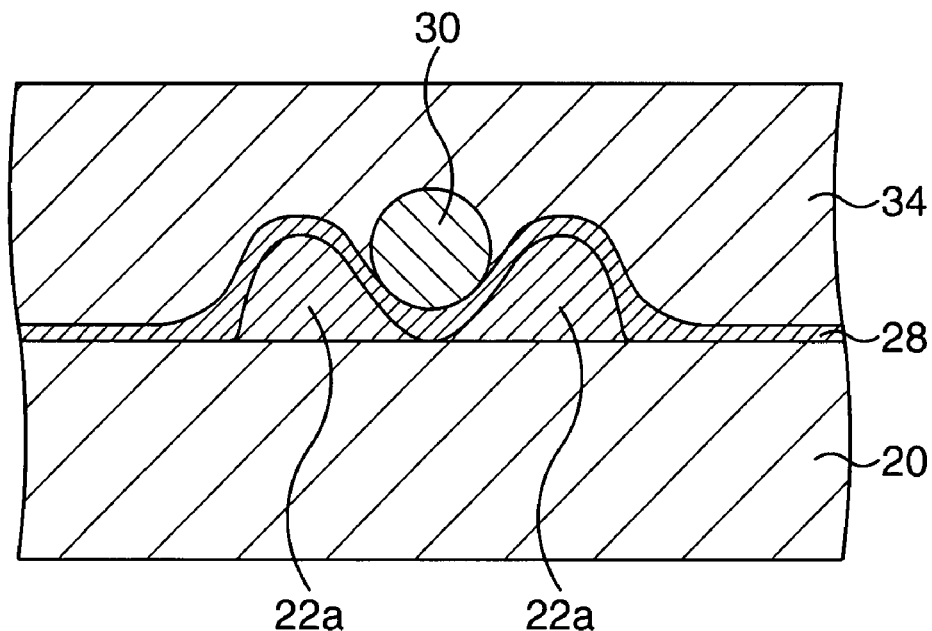
FIG. 7A is a section view showing a structure of a quantum device according to a second embodiment of the present invention.
Figure 7B:
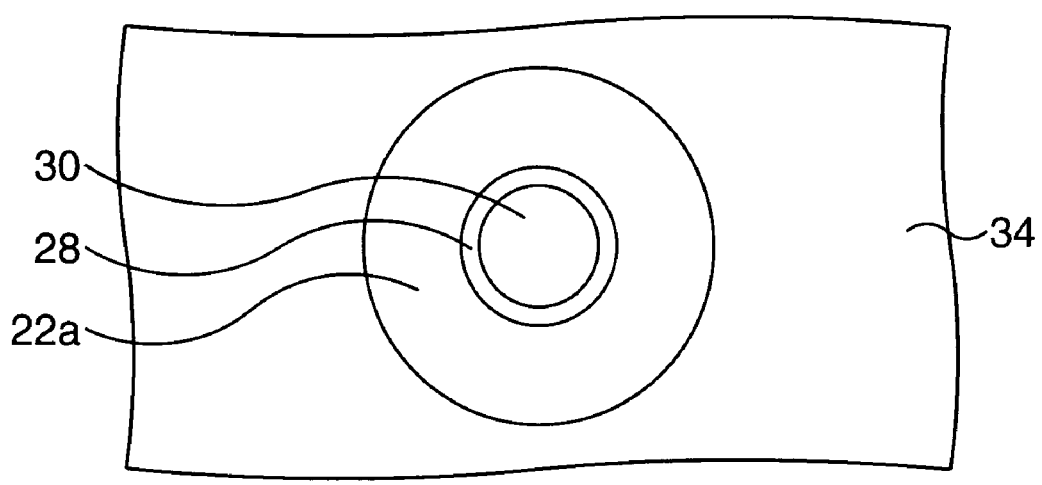
FIG. 7B is a plan view showing the structure of the quantum device according to the second embodiment.

Subsequently, the description will be given on the second embodiment of the present invention. FIG. 7A is a section view showing a structure of a quantum device according to the second embodiment of the present invention and FIG. 7B is a plan view showing the structure of the quantum device according to the second embodiment.

In the second embodiment, a quantum ring 22a is formed on a GaAs substrate 20. The quantum ring 22a is formed, for example, by growing InAs. A single electron exists in the quantum ring 22a. Also, a barrier layer 28 covering the quantum ring 22a and the GaAs substrate 20 is formed. Further, on the barrier layer 28, a quantum dot 30 for detection is formed at a position above the center of the quantum ring 22a. A cap layer 34 covering the quantum dot 30 and so forth is formed.

In the second embodiment as described above, the effective distance between the quantum ring 22a being a spin state readout target and the quantum dot 30 can be reduced to be shorter as compared to the first embodiment. Based on this, it is possible to read out the spin state with higher resolution.

Note that the formation method of the quantum ring 22a is not specifically limited. For example, two types of methods as will be described below are applicable. In a first method, after a quantum dot is formed on the GaAs substrate 20, a thin cap layer is formed. The quantum dot is then changed into a ring shape by annealing. In a second method, the surface of the GaAs substrate 20 is oxidized into a ring shape while contacting a tip of an atomic force microscope (AFM) to the GaAs substrate 20 to form an oxide film, and the oxide film is removed to thereby form a groove of a ring shape. Subsequently, a semiconductor layer (for example, an InAs layer) is grown in the ring-shaped groove.

Note that the materials of the respective portions composing the quantum device are not limited to those described in the first embodiment and the second embodiment. For example, it is possible to adopt a heterojunction structure in which a type II band offset exists between the quantum dot for detection and the cap layer (matrix) covering the quantum dot. As an example thereof (quantum dot/matrix), Ga(In)AlAs/AlAs, In(Ga, Al)As/Ga(In, Al)Sb(As), In(Ga)P/Al(In)As, and so forth can be cited. For the quantum dot for detection, any allowing the ODMR readout is acceptable. Further, an electron can exist in the quantum dot and so forth, by an impurity doping, an optical electron injection, an electrical electron injection, or the like.

Further, although the combination of the quantum ring and the quantum dot for detection is adopted in the second embodiment, a quantum ring for detection may be used by making the spin-state readout target be a quantum dot.

INDUSTRIAL APPLICABILITY

As has been detailed in the above, according to the present invention, the spin state in the quantum dot and the like can be read out with the simple structure. Further, there is little possibility that the spin state may change in the readout, allowing the correct state to be detected.

What is claimed is:

1. A quantum device comprising:
   a first quantum structure having a single electron;
   a second quantum structure capable of emitting light; and
   a barrier layer formed between said first and second quantum structures,
   wherein a ground level of an electron in said second quantum structure is higher than a ground level of an electron in said first quantum structure,
   a band gap of said barrier layer is larger than band gaps of said first and second quantum structures, and
   an exciton lifetime of said second quantum structure is 10 ns or more.

2. The quantum device according to claim 1, wherein said first quantum structure is a quantum dot.

3. The quantum device according to claim 1, wherein said second quantum structure is a quantum dot.

4. The quantum device according to claim 2, wherein said second quantum structure is a quantum ring.

5. The quantum device according to claim 3, wherein said first quantum structure is a quantum ring.

6. The quantum device according to claim 1, wherein the single electron in said first quantum structure is made exist by a process of one type selected from a group consisting of an impurity doping, an optical injection and an electrical injection.

7. The quantum device according to claim 1, wherein difference between the ground level of the electron in said second quantum structure and the ground level of the electron in said first quantum structure is 100 meV or more.

8. The quantum device according to claim 1, wherein an effective distance between said first and second quantum structures is 5 nm or below.

9. The quantum device according to claim 1, wherein thickness of said barrier layer is 1 nm to 2 nm.

10. A control method of a quantum device including a first quantum structure having a single electron, a second quantum structure capable of emitting light, and a barrier layer formed between the first and second quantum structures, in which a ground level of an electron in the second quantum structure is higher than a ground level of an electron in the first quantum structure, and a band gap of the barrier layer is larger than band gaps of the first and second quantum structures, comprising:
    focusing a laser light pulse onto the second quantum structure while a magnetic field is applied to the quantum device;
    applying a microwave pulse to the quantum device; and
    detecting a polarized light emission from the second quantum structure,
    wherein, in said focusing the laser light, the first quantum structure is kept in a stable state without being excited.

11. The control method of the quantum device according to claim 10, wherein, in said step of applying the laser light, a position of the laser emission is controlled using a near-field optical microscope.

12. A manufacturing method of a quantum device, comprising:
    forming a first quantum structure;
    forming a barrier layer on or above the first quantum structure; and
    forming a second quantum structure on the barrier layer,
    wherein a ground level of an electron in the second quantum structure is higher than a ground level of an electron in the first quantum structure,
    a band gap of the barrier layer is larger than band gaps of the first and second quantum structures, and
    an exciton lifetime of said second quantum structure is 10 ns or more.

13. The manufacturing method of the quantum device according to claim 12, wherein a quantum dot is formed as the first quantum structure.

14. The manufacturing method of the quantum device according to claim 12, wherein a quantum dot is formed as the second quantum structure.

15. The manufacturing method of the quantum device according to claim 13, wherein a quantum ring is formed as the second quantum structure.

16. The manufacturing method of the quantum device according to claim 14, wherein a quantum ring is formed as the first quantum structure.

17. The control method of the quantum device of claim 10, wherein an exciton lifetime of said second quantum structure is 10 ns or more.

* * * * *